United States Patent [19]

Cronin

[11] Patent Number: 5,163,850

[45] Date of Patent: * Nov. 17, 1992

[54] ELECTROSTATIC DISCHARGE PROTECTION DEVICES FOR SEMICONDUCTOR CHIP PACKAGES

[75] Inventor: David V. Cronin, Peabody, Mass.

[73] Assignee: Polaroid Corporation, Cambridge, Mass.

[*] Notice: The portion of the term of this patent subsequent to Apr. 28, 2009 has been disclaimed.

[21] Appl. No.: 800,612

[22] Filed: Nov. 27, 1991

Related U.S. Application Data

[63] Continuation-in-part of Ser. No. 687,044, Apr. 18, 1991, Pat. No. 5,108,299.

[51] Int. Cl.$^5$ ..................... H01R 9/09; H01R 13/703
[52] U.S. Cl. .................... 439/507; 206/331; 361/220
[58] Field of Search ................ 439/507–515, 439/188, 189; 361/220; 206/228, 331

[56] References Cited

U.S. PATENT DOCUMENTS

| | | | |
|---|---|---|---|
| 3,382,575 | 5/1968 | Gannoe | 29/879 |
| 3,653,498 | 4/1972 | Kisor | 206/46 H |
| 3,774,075 | 11/1973 | Medesha | 361/220 |
| 3,908,153 | 9/1975 | Cason, Jr. | 439/507 |
| 4,019,094 | 4/1977 | Dinger et al. | 439/511 |
| 4,471,408 | 9/1984 | Martinez | 361/17 |
| 4,617,605 | 10/1986 | Obrecht et al. | 361/220 |
| 4,706,161 | 11/1987 | Buckingham | 361/220 |
| 4,780,604 | 10/1988 | Hasegawa | 361/220 |
| 4,971,568 | 11/1990 | Cronin | 439/188 |
| 5,038,248 | 8/1991 | Meyer | 361/212 |

FOREIGN PATENT DOCUMENTS

| | | |
|---|---|---|
| 0071031 | 2/1983 | European Pat. Off. |
| 2348630 | 4/1975 | Fed. Rep. of Germany |
| 59-13353 | 5/1984 | Japan |
| 61-148852 | 11/1986 | Japan |
| 62-276855 | 5/1988 | Japan |

OTHER PUBLICATIONS

IBM Bulletin, Every et al., vol. 21, No. 10, p. 3984, Mar. 1979.

Navy Technical Disclosure Bulletin, vol. 6, No. 3, Mar. 1981, pp. 33-36, entitled "Electrical Shorting Cap" by Carlton G. Middlebrook.

*Primary Examiner*—Neil Abrams
*Attorney, Agent, or Firm*—Ralph R. Veseli; Edward S. Roman

[57] ABSTRACT

A plurality of electrostatic discharge (hereafter referred to as "ESD") protection devices are disclosed for use with semiconductor chip packaging (hereafter referred to as "SCP"). The electrostatic protection devices comprise electrically conductive shorting devices that may be removably connected to the SCP during the manufacture to short selected pins from the SCP. The ESD protection devices remain in place to provide ESD protection during all phases of handling and shipping and may be either automatically unshorted or be manually removed during final assembly when the SCP is installed in its end product.

11 Claims, 18 Drawing Sheets

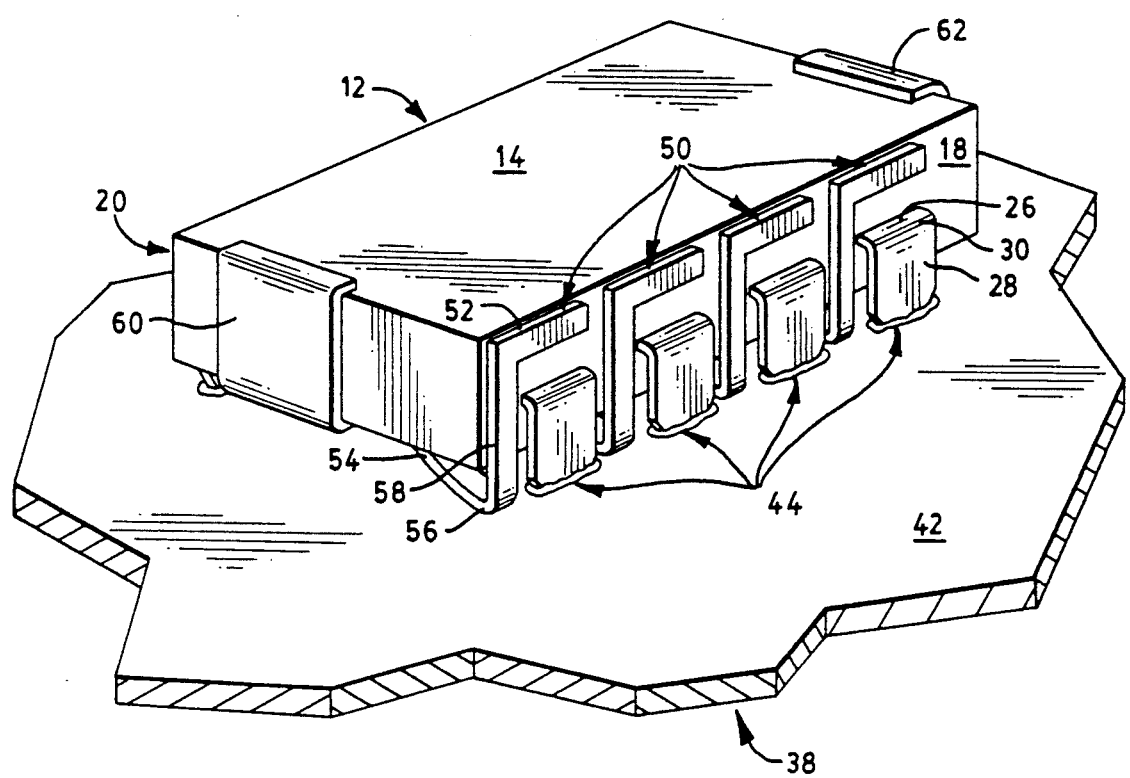
FIG. IC

ELECTROSTATIC DISCHARGE PROTECTION DEVICES FOR SEMICONDUCTOR CHIP PACKAGES

CROSS REFERENCE TO RELATED APPLICATION

This application is a continuation in part of copending U.S. patent application Ser. No. 687,044 filed on Apr. 18, 1991, now U.S. Pat. No. 5,108,299.

1. Field of the Invention

This invention relates to various electrostatic discharge (hereafter referred to as "ESD") protection devices for various semiconductor chip packages (hereinafter referred to as "SCP") of the type having a plurality of connector pins which are either (a) continuously shorted and then, upon insertion of the connector pins into complementary receptacles, automatically unshorted or (b) continuously shorted until the physical removal of the ESD protection device from the SCP.

2. Background of the Invention

For a plurality of connector pins of a SCP which mates with a corresponding plurality of receptacles in a connector, typically, a printed circuit board, it is frequently necessary to short together the connector pins of the SCP until they are inserted into complementary receptacles in the connector in order to protect the semiconductor's circuitry from ESD. Present ESD protection devices consist primarily of ESD packaging of the SCP in electrically conductive strips, pellets, boxes and plastic tubing which provides effective ESD protection until the User is about to inserts the connector pins of the SCP into the complementary receptacles in the connector. At that point, however, the User must remove this ESD packaging from the SCP, thus rendering the SCP vulnerable to ESD, in order to position and insert the connector pins into the receptacles. Accordingly, as the User inserts the connector pins of the SCP into the receptacles, the semiconductor dies housed within these SCP's could be destroyed by ESD and would have to be replaced. Moreover certain types of SCPs typically EPROMs, UVPROMs, and DRAMs, are plug-in devices which have connector pins which are repeatedly inserted into and then removed from the receptacles. These types of SCPs require ESD protection during the repeated insertions into and removals from the receptacles. Specifically, the connector pins of these SCPs require ESD protection from the moment that their connector pins are removed from the receptacles till their connector pins are again inserted therein. Consequently, a need still exists within the semiconductor chip packaging industry for a true ESD protection device, rather than ESD packaging, which effectively protects the semiconductor die from ESD until the connector pins of the SCP are inserted into the receptacles of the connector and then protects the semiconductor die from ESD again when the connector pins are removed from their respective receptacles.

SUMMARY OF THE INVENTION

With the foregoing in mind, the primary object of the present invention is to provide an ESD protection device on a SCP which operates in a simple, economical, and effective manner to automatically short a plurality of connector pins together while the SCP is disconnected from a connector.

It is a further object of the present invention to provide an ESD protection device on a SCP which operates to automatically open the shorts between the plurality of connector pins upon the SCP's connection to a connector which has not been specifically adapted to effect such opening.

It is yet another object of the present invention to provide an ESD protection device on a SCP which operates to automatically short a plurality of connector pins until the ESD protection device is physically removed from the SCP.

According to this invention, the foregoing objects are achieved by several different ESD protection devices, each discussed below, which are disposed on the top or bottom surface of a SCP.

The SCPs are of the type that have a top surface, a bottom surface, and, disposed between the top and bottom surfaces, a plurality of interface surfaces each having a plurality of substantially parallel and evenly spaced apart connector pins disposed thereon. Each connector pin comprises a first portion extending outward from the interface surface, a second portion of substantially the same width as the first portion extending in a downward direction, a bent portion interconnecting the first and second portions, a third portion extending downward to its distal end, and an interface portion interconnecting the second and third portions.

In the first embodiment, the ESD protection device comprises a base section secured to the bottom surface of the SCP and a plurality of integral shorting arms. The plurality of shorting arms extend outwardly from the base section with their plurality of distal end portions in spaced apart relationship with respect to each other and being transversely disposed with respect to the connector pins. Each shorting arm comprises a first portion fixedly secured to the base section and extending outwardly from the bottom surface, a knee portion which extends from the first portion and below the interface portion of a respective one of the connector pins to define a bend in the shorting arm, and an intermediate portion which extends from the bend towards the respective one connector pin so that the distal end portion extends over the first portion of the respective connector pin. Each shorting arm further comprises means for yieldably biasing the shorting arm so as to urge its distal end portion against the first portion of the respective one connector pin thereby creating an electrical connection therebetween when the plurality of connector pins are not inserted into a complementary plurality of receptacles. When the connector pins are inserted into the complementary receptacles, each knee portion moves towards the bottom surface of the SCP against its yieldable bias so as to disengage its distal end portion from the first portion of a respective one of the connector pins to break the electrical connection therebetween. Finally, an adhesive disposed on the base section or a pair of clips disposed on the ends of the base section provide this ESD protection device with a secure attachment to the SCP.

In the second embodiment, the ESD protection device comprises a base section secured to the top surface of the SCP and a plurality of shorting arms and gripping members which are both integral to the base section. The plurality of shorting arms extend outwardly from the base section in spaced apart relationship with respect to each other and in spaced apart alignment with respect to the plurality of connector pins. Each shorting arm has a first portion which is integral to the base section and which extends outwardly and downwardly from the base section to define a transverse edge portion. Each transverse edge portion engages the first portion of a respective one of the connector pins so as to electrically connect the shorting arm and the connector pin. Similarly, the plurality of gripping members extend from integral connection to the base section in an interdigitated spaced apart relationship with respect to the plurality of shorting arms so as to provide the base section with support and stability against lateral movement. Each gripping member has a first portion extending along the top surface of the SCP and an integral second portion which securely grasps the SCP at an interface surface. Finally, an adhesive disposed on the base section or a pair of clips disposed on the ends of the base section provide this ESD protection device with a secure attachment to the SCP.

In the third embodiment, the ESD protection device comprises a base section secured to the top surface of the SCP and a plurality of shorting arms and gripping members which are both integral to the base section. The plurality of shorting arms extend outwardly from the base section with distal end portions in spaced apart relationship with respect to each other and in spaced apart alignment with respect to the plurality of connector pins. Each shorting arm has a first portion which is integral to the base section and which extends outwardly from the base section in an integral connection to a respective one of the distal end portions. Moreover, each first portion is wider than its distal end portion so as to define a transverse edge portion. Similarly, the plurality of gripping members extend from integral connection to the base section in an interdigitated spaced apart relationship with respect to the plurality of shorting arms so as to provide the base section with support and stability against lateral movement. Each gripping member has a first portion extending along the top surface of the SCP and an integral second portion which securely grasps the SCP at an interface surface. Each shorting arm further comprising means for yieldably biasing the shorting arm so as to urge its transverse edge portion against the first portion of the respective one of the connector pins thereby creating an electrical connection therebetween when the plurality of connector pins are not inserted into a complementary plurality of receptacles. When the connector pins are inserted into the complementary receptacles, each distal end portion of the shorting arms moves towards the bottom surface of the SCP against its yieldable bias so as to disengage its transverse edge portion from its respective connector pin to break the electrical connection therebetween. Finally, an adhesive disposed on the base section or a pair of clips disposed on the ends of the base section provide this ESD protection device with a secure attachment to the SCP.

In the fourth embodiment, the ESD protection device comprises a plurality of electrically conductive bars each disposed in an overlying relation with respect to the plurality of connector pins extending from each interface surface and a spring structure mounted to the top surface of the SCP for urging the plurality of conductive bars against the conductor pins. The spring structure has a central pad securely mounted with an adhesive to the top surface of the SCP and a plurality of spring members integral to the central pad and corresponding in number to the number of electrically conductive bars. Each spring member has an integral cantilevered portion fixedly secured at one end to the central pad and extending outwardly beyond the top surface and an integral pair of spaced apart depending leg portions extending downwardly on both sides of the respective plurality of connector pins and beyond the bottom surface. Each corresponding electrically conductive bar is securely mounted with an adhesive to its corresponding cantilevered portion adjacent to the interface between its cantilevered portion and its pair of leg portions so as to selectively engage its respective plurality of connector pins on an interface surface. Each spring member further comprises means for biasing the spring member to the cantilevered portion towards the top surface of the SCP so as to urge the electrically conductive bar associated therewith against its respective connector pins thereby creating an electrical connection therebetween when the SCP is not positioned against a surface of a connector. When the SCP is positioned against the surface of the connector, each cantilevered portion moves away from the top surface of the SCP against its yieldable bias so as to disengage its electrically conductive bar from its respective plurality of connector pins on the interface surface to break the electrical connection therebetween.

In the fifth embodiment, the ESD protection device comprises a base section which may be overlaid on and secured to the top surface of the SCP and a plurality of shorting arms which are integral to the base section. The plurality of shorting arms extend outwardly from the base section with distal end portions in spaced apart relationship with respect to each other and in spaced apart alignment with respect to the plurality of connector pins when the ESD protection device is secured to the SCP. Each shorting arm has a first portion which is integral to the base section and which extends outwardly from the base section in an integral connection to a respective one of the distal end portions. Moreover, each first portion is wider than its distal end portion so as to define at least one lateral edge portion which is moveable into engagement with the first portion of at least one respective connector pin. Each shorting arm further comprises means for yieldably biasing the respective shorting arm so as to urge the lateral edge portions of adjacent pairs of shorting arms against the first portion of respective ones of the connector pins thereby creating an electrical connection therebetween when the plurality of connector pins are not inserted into a complementary plurality of receptacles. When the connector pins are inserted into the complementary receptacles, each distal end portion of the shorting arms moves apart from its respective connector pin against its yieldable bias so as to disengage its lateral edge portion from its respective connector pin to break the electrical connection therebetween. A pair of clips disposed on the ends of the base section or an adhesive provide this ESD protection device with a secure attachment to the SCP. Finally, a stiffening rib disposed integrally within the base section provides stiffness to the base section while pull tabs disposed on the ends of the stiffening rib provide for the quick and easy removal of this ESD protection device from the SCP.

In the sixth and seventh embodiments, the ESD protection device comprises a base section which may be overlaid on and secured to the top surface of the SCP and a plurality of shorting arms which are integral to the base section. The plurality shorting arms extend outwardly from the base section in spaced apart relationship with respect to each other and in spaced apart alignment with respect to the plurality of connector pins when the ESD protection device is secured to the SCP. Each shorting arm has a member which is integral to the base section and which extends outwardly and downwardly from the base section to define at least one lateral edge portion which is moveable into engagement with the first portion of at least one respective connector pin. Each shorting arm further comprises means for yieldably biasing the respective shorting arm so as to urge the lateral edge portions of adjacent pairs of shorting arms against the first portion of respective ones of the connector pins thereby creating an electrical connection therebetween. In the seventh embodiment, there are shown bifurcated shorting arms where slots physically separate adjacent lateral edge portions that were connected in the sixth embodiment and these slots provide each adjacent lateral edge portion with the ability to move independently of the other so as to independently engage the first portion of their respective connector pin. A pair of clips disposed on the ends of the base section or an adhesive provide this ESD protection device with a secure attachment to the SCP. A stiffening rib disposed integrally within the base section provides stiffness to the base section while pull tabs disposed on the ends of the stiffening rib provides for the quick and easy removal of the ESD protection device from the SCP.

In the eight and final embodiment, the ESD protection device comprises a base section which may be overlaid on and secured to the top surface of the SCP and a plurality of shorting arms which are integral to the base section. The plurality of shorting arms extend outwardly from the base section in spaced apart relationship with respect to each other and in an overlying spaced apart relationship with respect to corresponding ones of the plurality of connector pins. Each shorting arm has a member which is integral to the base section and which extends outwardly and downwardly from the base section to define an integral protuberance at its distal end which engages the second portion of at least one of the connector pins. A pair of clips disposed on the ends of the base section or an adhesive provide this ESD protection device with a secure attachment to the SCP while pull tabs disposed on the ends of the stiffening rib provide for the quick and easy removal of the ESD protection device from the SCP.

DESCRIPTION OF THE DRAWINGS

The novel features that are considered characteristic of the invention are set forth with particularity in the appended claims. The invention itself, however, both as to its organization and its method of operation together with other objects and advantages thereof will be best understood from the following description of the illustrated embodiment when read in connection with the accompanying drawings wherein:

FIG. 1C is a perspective view of the ESD protection device-SCP sub-assembly shown in FIG. 1B mated to a printed circuit board;

DESCRIPTION OF THE PREFERRED EMBODIMENTS

Figure 1A:
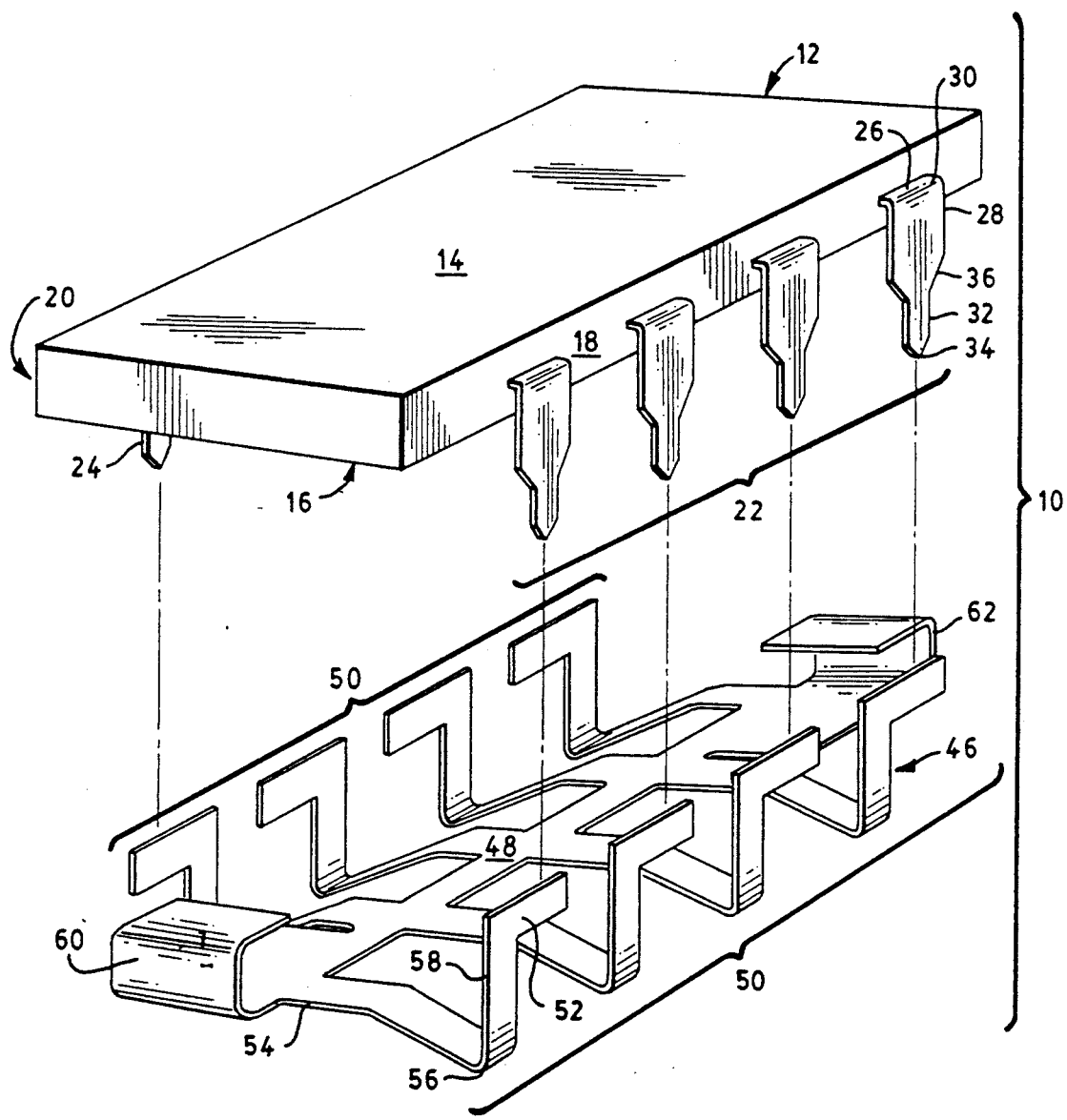
FIG. 1A is an exploded perspective view of an ESD protection device of this invention disposed below a SCP.
Figure 1B:
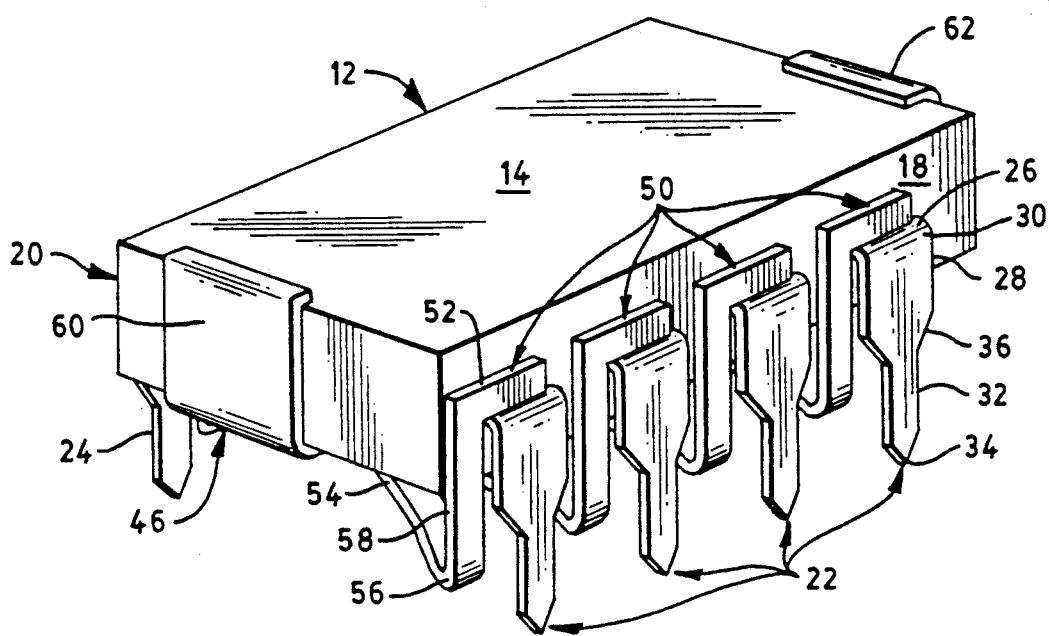
FIG. 1B is a perspective view of the ESD protection device shown in FIG. 1A mated to the bottom surface of the SCP shown in FIG. 1A.

Referring now to FIGS. 1A–1C, there is shown generally at 10 a SCP-ESD protection device combination comprising an ESD protection device 46 of this invention, a SCP 12, and a complementary connector 38. The SCP 12 in one embodiment may comprise a top surface 14, a bottom surface 16, and, between the top and bottom surfaces, a pair of interface surfaces 18 and 20. A plurality of connector pins 22 and 24, respectively, are disposed on each interface surface 18 and 20, respectively, in a substantially parallel and spaced apart relationship with respect to each other. Each of the plurality of connector pins 22, 24 further comprises a first portion 26 extending outwardly from the corresponding interface surface 18, 20, a second portion 28 of substantially the same width as the first portion 26 extending in a downward direction, a bent portion 30 interconnecting the first portion 26 and the second portion 28, a third portion 32 narrower than the first portion 26 and extending downward to its distal end 34, and an interface portion 36 which interconnects the second portion 28 and the third portion 32. As will be readily understood, the SCP 12 may house either a VLSI, LSI, or MSI semiconductor die or dies.

The plurality of the connector pins 22, 24 are adapted for physical and electrical connection to the connector 38, typically a printed circuit board, having a substantially planar surface 42 on one selected side thereof. A plurality of elongated receptacles 44 extend inwardly from the planar surface 42 in a substantially parallel spaced apart insulated relationship and in a complementary relationship with respect to the connector pins 22, 24 so as to accommodate the ready insertion of the third portion 32 of the connector pins 22, 24 into the respective ones of the receptacles 44.

In order to ensure that the connector pins 22, 24 are shorted until they are secured in the complementary receptacles 44, the ESD protection device 46 is provided. This ESD protection device 46 comprises a base section 48 secured to the bottom surface 16 of the SCP 12 and a plurality of integral shorting arms 50. The plurality of shorting arms 50 extend outwardly from the base section 48 with their distal end portions 52 in spaced apart relationship with respect to each other and transversely disposed with respect to the connector pins 22, 24, respectively. Each shorting arm 50 comprises a first portion 54 fixedly secured to the base section 48 and extending outwardly from the bottom surface 16, a knee portion 56 extending from the first portion 54 to define a bend in the shorting arm below the interface portion 36 of a respective one of the plurality of connector pins 22, 24 and an intermediate portion 58 extending from the bend towards the respective one of the plurality of connector pins 22, 24 so that the distal end portion 52 extends over the first portion 26 of the respective one of the plurality of connector pins 22, 24. An adhesive (not shown) disposed on the base section 48 or a pair of clips 60, 62 disposed on the ends of the base section provides the ESD protection device 46 with a secure attachment to the SCP 12.

The plurality of shorting arms 50 are yieldably biased by any means well known in the art such as a built in resilient spring bias so as to urge their respective distal end portions 52 against the first portions 26 of respective ones of the plurality of connector pins 22, 24 thereby creating an electrical interconnection between the plurality of shorting arms 50 and the plurality of connector pins 22, 24. Thus, as is readily apparent from FIGS. 1A-1C, when the plurality of connector pins 22, 24 are not inserted into the corresponding plurality of receptacles 44, the shorting arms 50 urge their respective distal end portions 52 against and into respective electrical connection with the first portions 26 of the respective plurality of connector pins 22, 24. In this manner, the shorting of all or some of the plurality of connector pins 22, 24 is accomplished so as to effectively protect the semiconductor die (not shown) within the SCP 12 from ESD which could operate to damage the electrical circuitry in the semiconductor die.

Insertion of the connector pins 22, 24 into the complementary receptacles 44 in the connector 38 operates to move and deflect upwards the knee portion 56 of the shorting arms 50 against their yieldable bias, thereby moving the distal end portions 52 out of physical and electrical connection with the first portions 26 of the connector pins 22, 24, respectively.

As will be readily apparent, the number of connector pins 22, 24 on either interface surface 18, 20 to be shorted together by this ESD protection device 46 need not include all the connector pins 22, 24 as shown in FIGS. 1A-1C but may also be limited to any subset of all the conductive pins. Moreover, only a subset of all the connector pins 22, 24 on just one interface surface 18, 20 may be shorted together by this ESD protection device 46 while all the other connector pins 22, 24 remain unshorted.

Figure 2A:
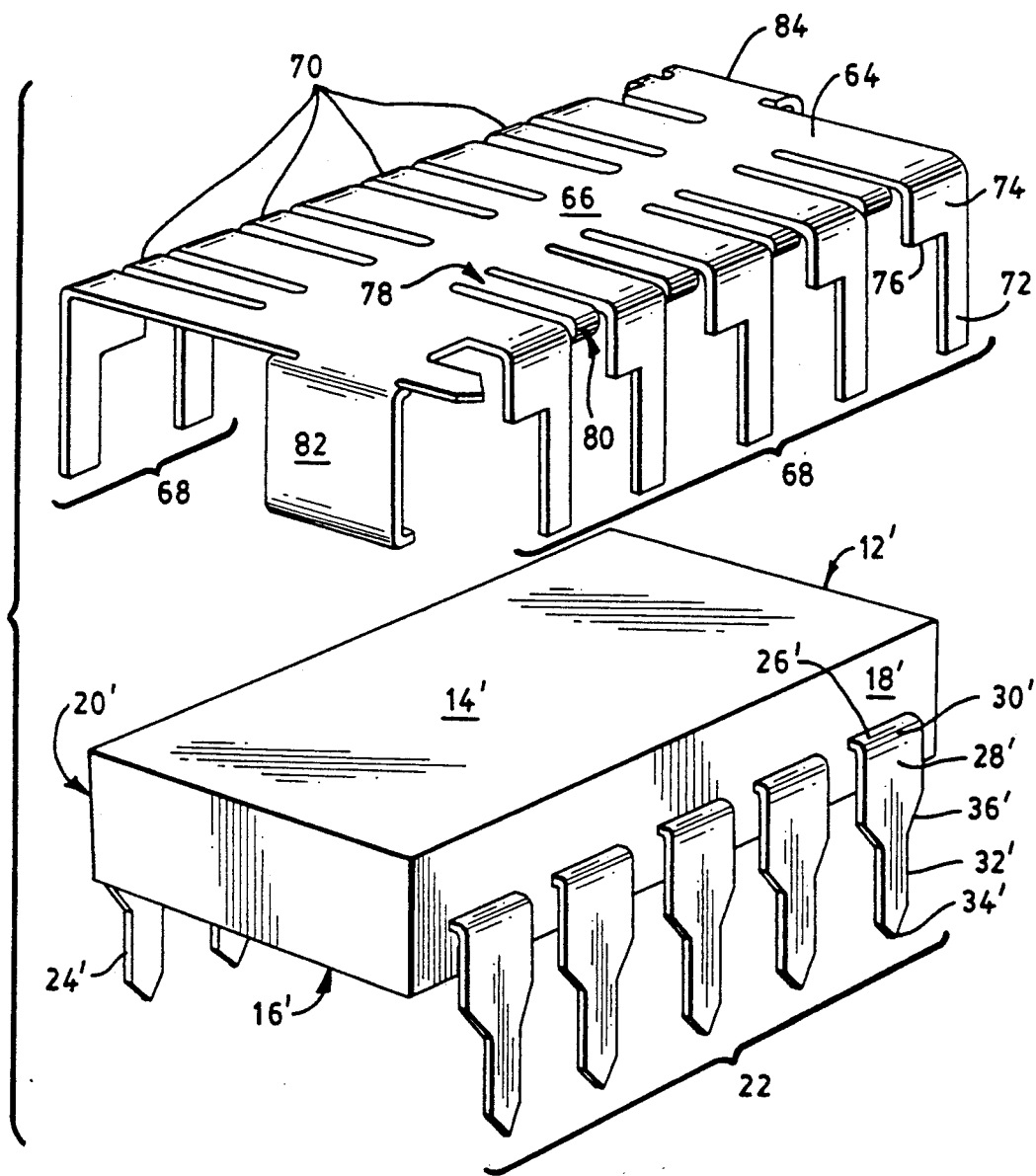
FIG. 2A is an exploded perspective view of another ESD protection device of this invention disposed above a SCP.
Figure 2B:
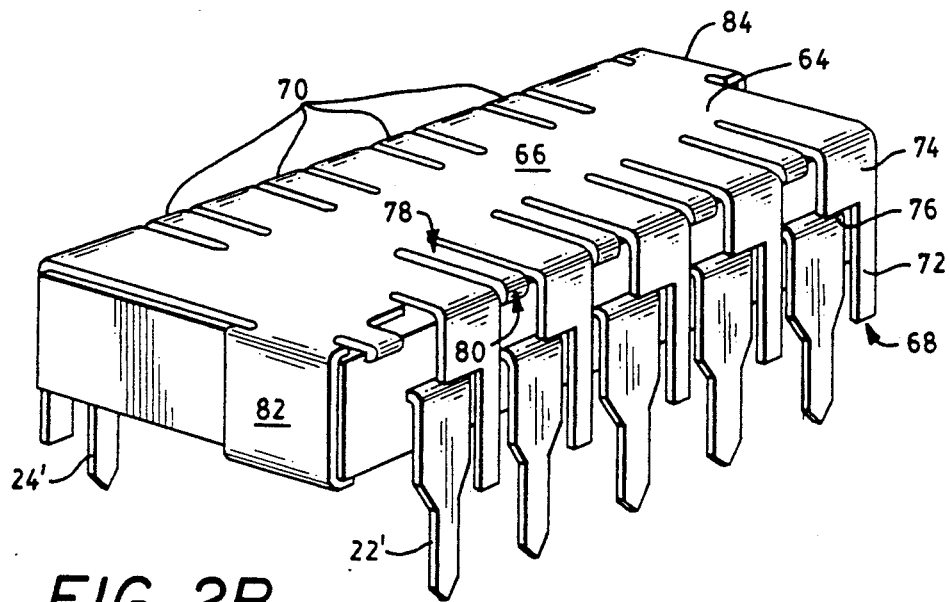
FIG. 2B is a perspective view of the ESD protection device shown in FIG. 2A mated to the top surface of the SCP shown in FIG. 2A.
Figure 2C:
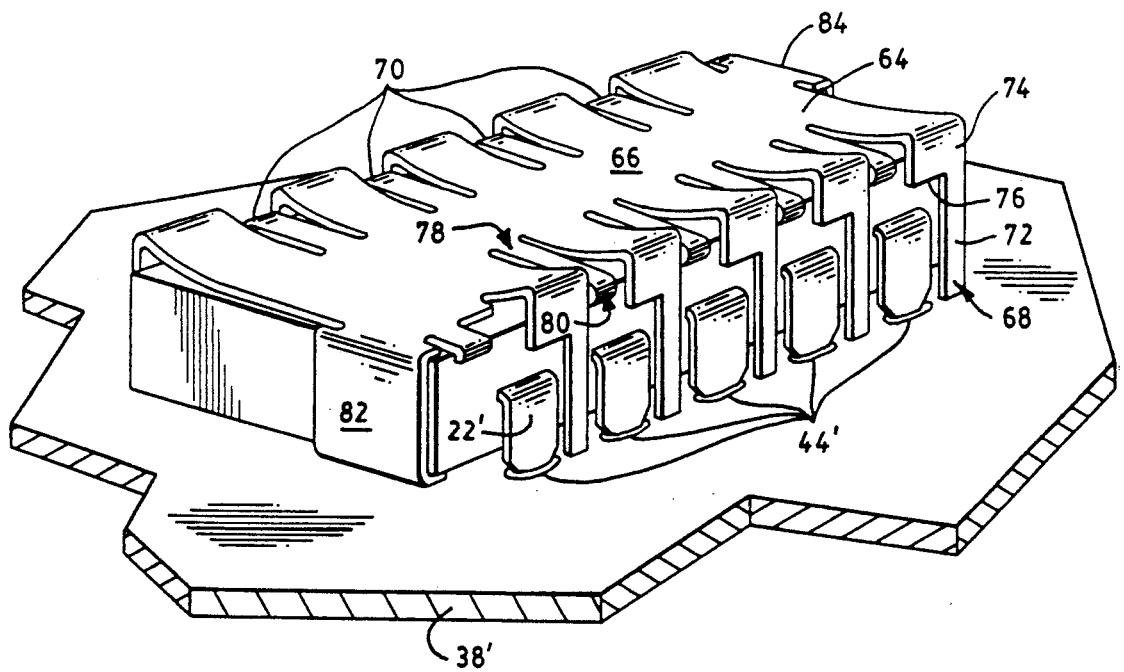
FIG. 2C is a perspective view of the ESD protection device-SCP sub-assembly shown in FIG. 2B mated to a printed circuit board.

Referring now to FIGS. 2A-2C where like numerals designate previously described elements, there is shown a second embodiment of the ESD protection device 64 for the SCP 12' and the connector 38'. In contrast to the first embodiment of the ESD protection device 46, this ESD protection device 64 is disposed on the top surface 14' of the SCP 12'. This unitary ESD protection device 64 comprises a base section 66 secured to the top surface 14' of the SCP 12' and a plurality of shorting arms 68 and gripping members 70. The plurality of shorting arms 68 extend outwardly from the base section 66 with distal end portions 72 in spaced apart relationship with respect to each other and in spaced apart alignment with respect to the plurality of connector pins 22', 24'. Each of the plurality of shorting arms 68 has a first portion 74 which is integral to the base section 66 and which extends outwardly from the base section 66 in an integral connection to a respective one of the distal end portions 72. Moreover, each first portion 74 is wider than its distal end portion 72 so as to define a transverse edge portion 76.

Similarly, the plurality of gripping members 70 extend from integral connection to the base section 66 in an interdigitated spaced apart relationship with respect to the plurality of shorting arms 68 so as to provide the base section 66 with support and stability against lateral movement. Each of the gripping members 70 has a first portion 78 extending along the top surface 14' of the SCP 12' and an integral second portion 80 which securely grasps the SCP 12' at one of the interface surfaces 18', 20'. Furthermore, an adhesive (not shown) disposed on the base section 66 or a pair of clips 82, 84 disposed on the ends of base section 66 provides the ESD protection device 64 with a secure attachment to the SCP 12'.

The shorting arms 68 are yieldably biased by means well known in the art such as a built in resilient spring bias so as to urge their respective transverse edge portions 76 against the first portions 26' of the plurality of connector pins 22', 24', respectively, thereby creating an electrical interconnection between the plurality of shorting arms 68 and the plurality of connector pins 22', 24'. Thus, as is readily apparent from FIGS. 2A-2C, when the plurality of connector pins 22', 24' are not inserted into the corresponding plurality of receptacles 44', the shorting arms 68 urge their respective transverse edge portions 76 against and into respective electrical connection with the first portions 26' of the respective plurality of connector pins 22', 24'. In this manner, the shorting of all or some of the plurality of connector pins 22', 24' is accomplished so as to effectively protect the semiconductor die (not shown) within the SCP 12' from the ESD which could operate to damage the electrical circuitry within the semiconductor die.

Insertion of the connector pins 22', 24' into the complementary receptacles 44' operates to move and deflect upwards the distal end portions 72 of the shorting arms 68 against their yieldable bias, thereby moving the transverse edge portions 76 out of respective physical and electrical connection with the first portions 26' of the connector pins 22', 24'.

As will be readily apparent, the number of connector pins 22', 24' on either interface surface 18', 20' to be shorted together by this ESD protection device 64 need not include all the connector pins 22', 24' as shown in FIGS. 2A-2C but may also be limited to any subset of all the conductive pins. Moreover, only a subset of all the connector pins 22', 24' on just one interface surface 18', 20' may be shorted together by this ESD protection device 64 while all the other connector pins 22', 24' remain unshorted.

Figure 3A:
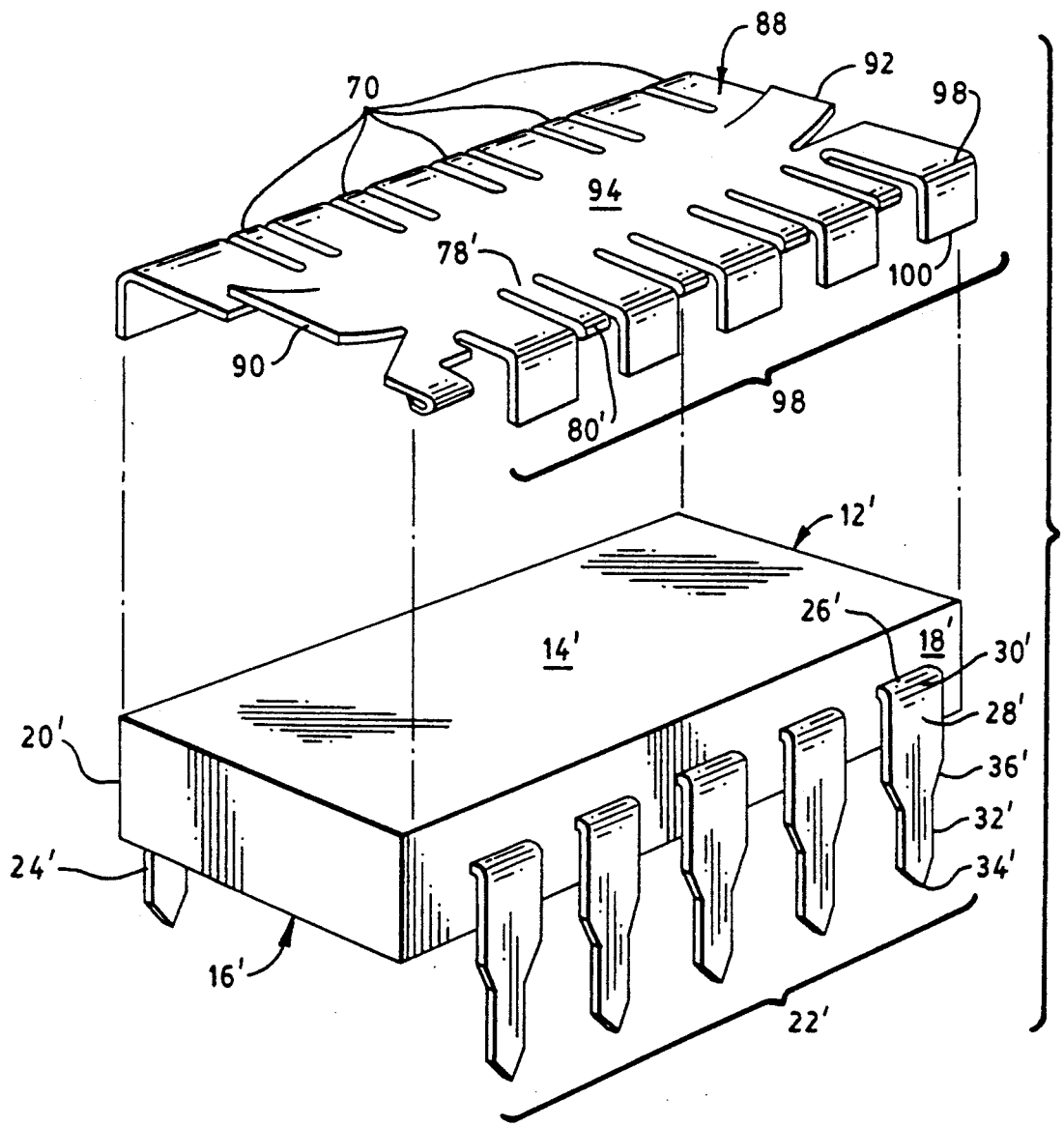
FIG. 3A is an exploded perspective view of another ESD protection device of this invention disposed above a SCP.
Figure 3B:
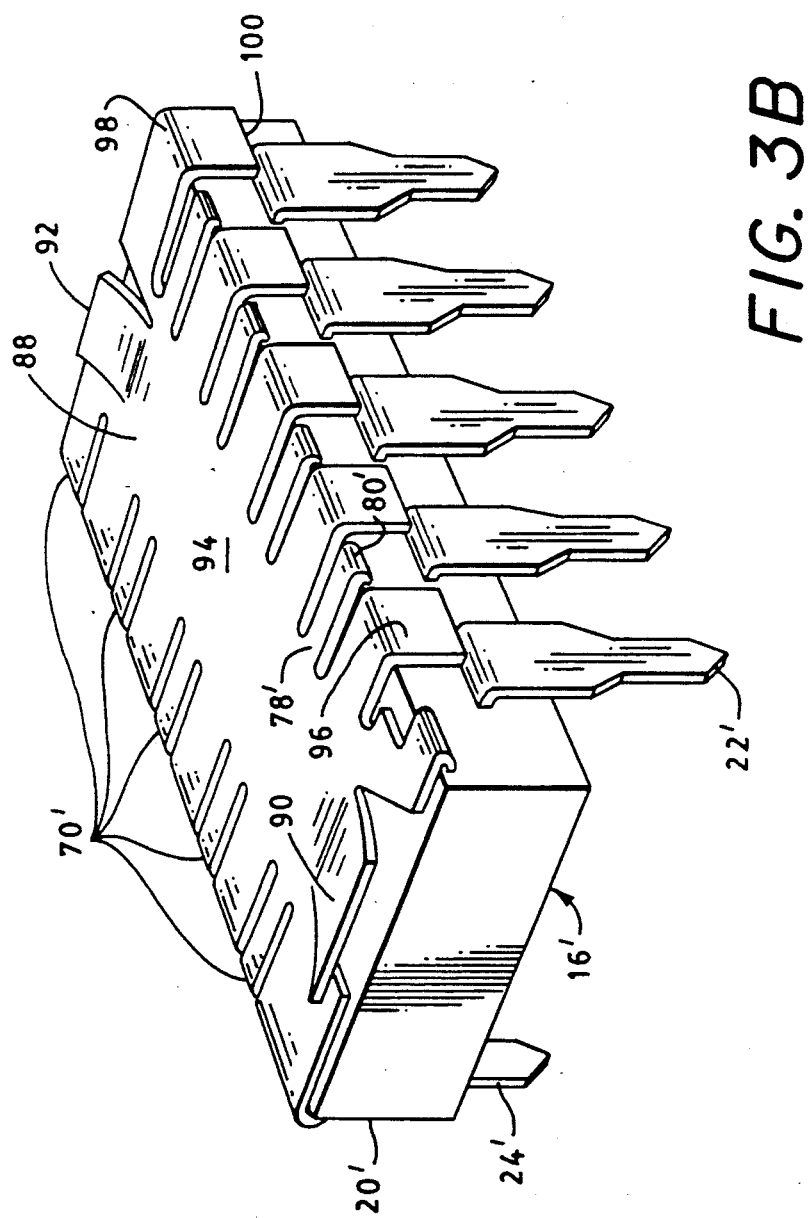
FIG. 3B is a perspective view of the ESD protection device shown in FIG. 3A mated to the top surface of the SCP shown in FIG. 3A.
Figure 4A:
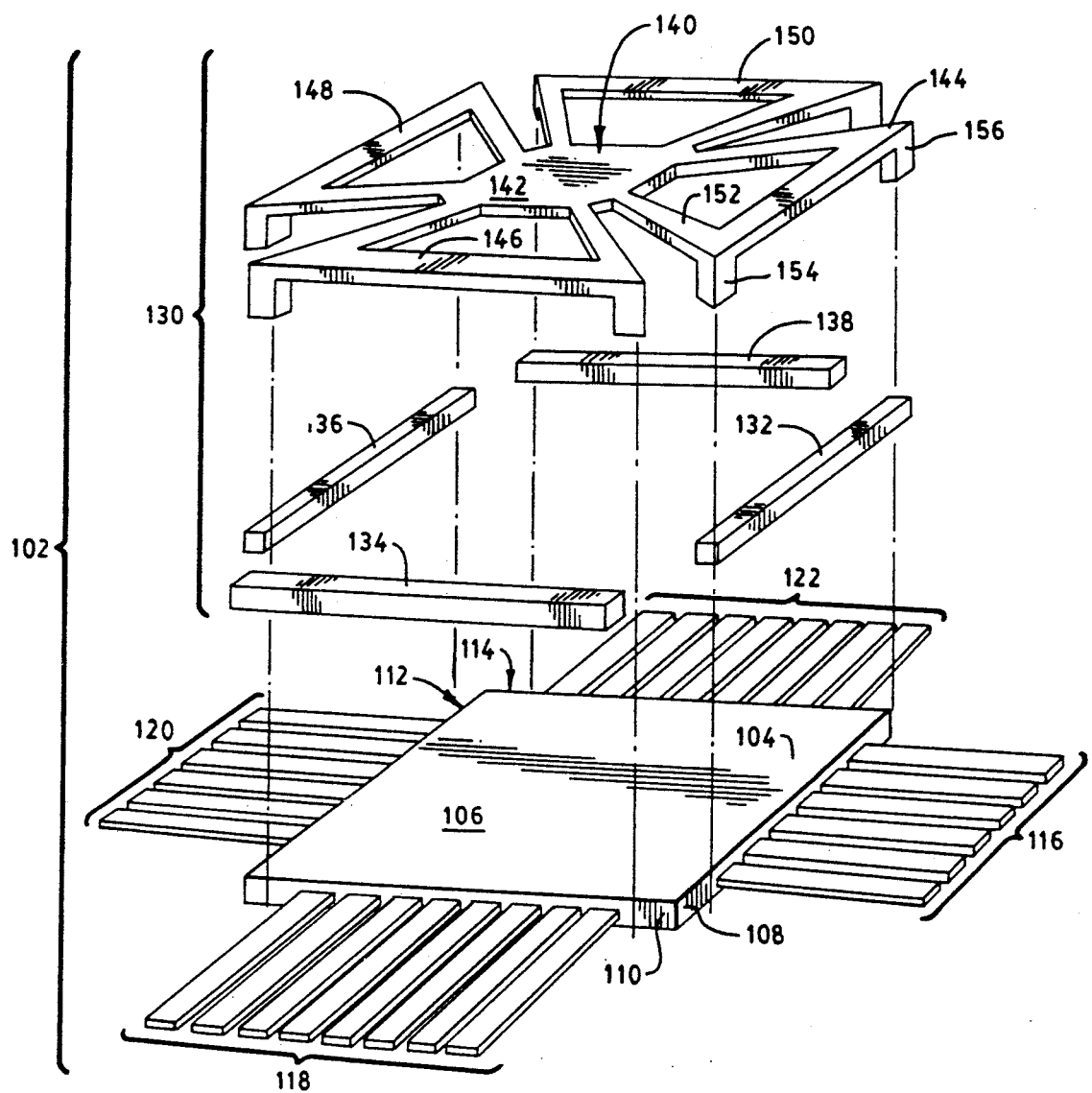
FIG. 4A is an exploded perspective view of another ESD protection device of this invention disposed above a SCP.
Figure 4B:
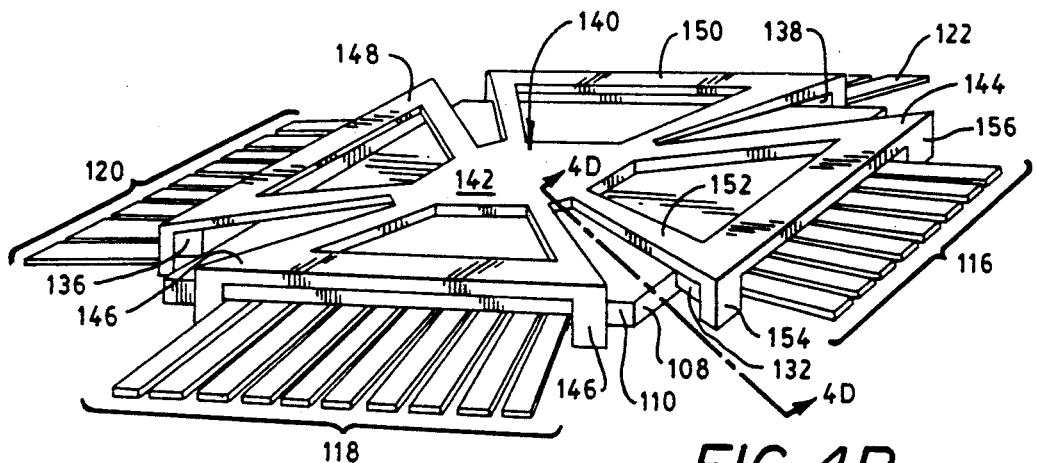
FIG. 4B is a perspective view of the ESD protection device shown in FIG. 4A mated to the top surface of the SCP shown in FIG. 4A.
Figure 4C:
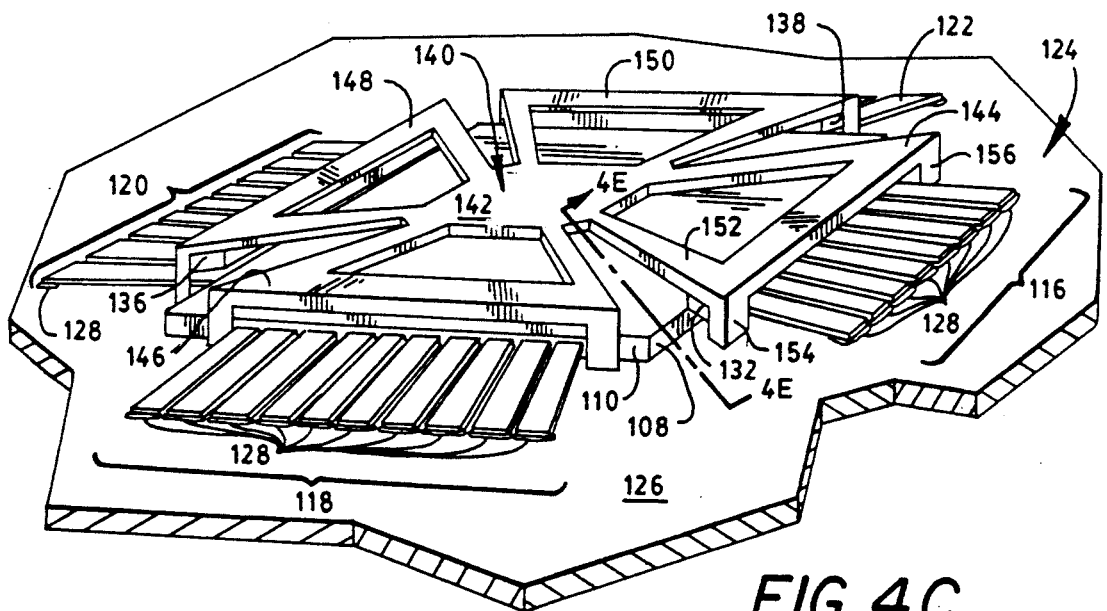
FIG. 4C is a perspective view of the ESD protection device-SCP sub-assembly shown in FIG. 4B mated to a printed circuit board.
Figure 4D:
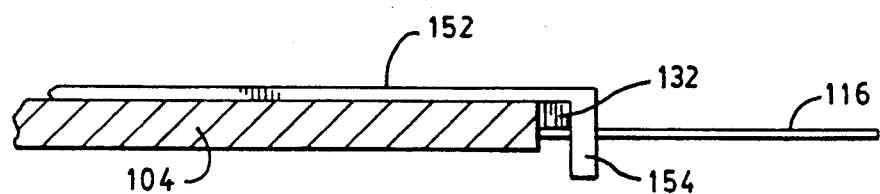
FIG. 4D is a side view as seen along line 4D—4D of FIG. 4B of the ESD protection device mated to the top surface of the SCP.
Figure 4E:
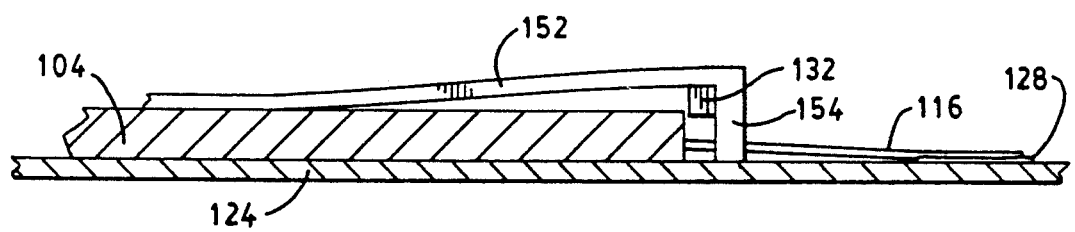
FIG. 4E is a side view as seen along line 4E—4E of FIG. 4C of the ESD protection device-SCP sub-assembly mated to the printed circuit board.

Referring now to FIGS. 3A-3B where like numerals designate previously described elements, there is shown a third embodiment of the ESD protection device 88 for the SCP 12' and the connector 38'. This third embodiment of the ESD protection device 88 is substantially similar to the second ESD protection device embodiment 64 described above. In contrast to the second embodiment, the clips of the second embodiment have been replaced with pull tabs 90, 92 so that only the adhesive (not shown) on the base section 94 in cooperation with the gripping members 70' secure this ESD protection device 88 to the top surface 14' of the SCP 12'. Like the second embodiment, this ESD protection device 88 comprises a base section 94 secured to the top surface 14' of the SCP 12' and a plurality of shorting arms 96 and gripping members 70' which are both integral to the base section 94. The plurality of gripping members 70', just as in the second ESD protection device embodiment, extend in an interdigitated spaced apart relationship with respect to the plurality of shorting arms 96 so as to provide the base section 94 with support and stability against lateral movement. Also, as in the second embodiment, each of the plurality of gripping members 70' comprises a first portion 78' extending along the top surface 14' of the SCP 12' and an integral second portion 80' which securely grasps the SCP 12' at an interface surface 18', 20'.

The plurality of shorting arms 96, as in the second embodiment, extend outwardly from the base section 94 in spaced apart relationship with respect to each other and in spaced apart alignment with respect to the plurality of connector pins 22', 24'. Unlike the second embodiment, however, each of the plurality of shorting arms 96 has only an integral first portion 98 extending outwardly and downwardly from the base section 94 to define a transverse edge portion 100 which engages the first portion 26' of a respective one of the connector pins 22', 24'. This means that the transverse edge portions 100 always electrically interconnect the shorting arms 96 to the plurality of connector pins 22', 24', respectively, regardless of whether or not the connector pins 22', 24' are inserted into the complementary receptacles (not shown) of a connector (not shown) because this embodiment lacks the means for urging the transverse edge portions 100 away from their corresponding first portions 26'. Thus, only the physical removal of this ESD protection device 88 from the top surface 14' of the SCP 12' by grasping and pulling the pull tabs 90, 92 will electrically disconnect the shorting arms 96 from the connector pins 22', 24'.

As was the case in the second ESD protection device embodiment 64, the number of connector pins 22', 24' on either interface surface 18', 20' to be shorted together by this third ESD protection device embodiment 88 need not include all the connector pins 22', 24' as shown in FIGS. 3A-3B but may also be limited to any subset of all the conductive pins. Moreover, only a subset of all the connector pins 22', 24' on just one interface surface 18', 20' may be shorted together by this ESD protection device 88 while all the other connector pins 22', 24' remain unshorted.

Referring now to FIGS. 4A-4E, there is shown generally at 102 another PCB-ESD protection device combination of this invention comprising a fourth ESD protection device embodiment, a SCP 104 and a complementary connector 124. The SCP 104 in one embodiment may comprise a top surface 106, a bottom surface (not shown), and, between the top and bottom surfaces, a plurality of interface surfaces 108, 110, 112, 114. A plurality of connector pins 116, 118, 120, 122 are disposed on the interface surfaces 108, 110, 112, 114, respectively, in a substantially parallel and spaced apart relationship with respect to each other. As will be readily understood, the SCP 104 may house either a VLSI, LSI, or MSI semiconductor die or dies.

The plurality of connector pins 116, 118, 120, 122 are adapted for physical and electrical connection to the connector 124, typically a printed circuit board, having a substantially planar surface 126 on one selected side thereof. A plurality of surface pads 128 exist on the planar surface 126 in a complementary relationship with respect to the connector pins 116, 118, 120, 122 so as to accommodate the ready soldering of the connector pins 116, 118, 120, 122 to the respective ones of the surface pads 12B.

In order to ensure that the connector pins 116, 118, 120, 122 are shorted until they are soldered to the complementary Surface pads 128, the ESD protection device 130 is provided. This ESD protection device 130 comprises a plurality of electrically conductive bars 132, 134, 136, 138 disposed in overlying relationship with respect to the plurality of connector pins 116, 118, 120, 122 respectively and a spring structure 140 mounted to the top surface 106 of the SCP 104 for urging the plurality of conductive bars 132, 134, 136, 138 against the respective conductor pins 116, 118, 120, 122. The spring structure 140 has a central pad 142 securely mounted with an adhesive (not shown) to the top surface 106 of the SCP 104 and a plurality of spring members 144, 146, 148, 150 integral to the central pad 142 and corresponding in number to the number of electrically conductive bars 132, 134, 136, 138. Each spring member 144, 146, 148, 150 has an integral cantilevered portion 152 fixedly secured at one end to the central pad 142 and extending outwardly beyond the top surface and an integral pair of spaced apart depending leg portions 154, 156 extending downwardly on both sides of a respective one of the plurality of connector pins 116, 118, 120, 122 and beyond the bottom surface (not shown). Each corresponding electrically conductive bar 132, 134, 136, 138 is securely mounted with an adhesive (not shown) to its corresponding cantilevered portion 152 adjacent to the interface between its cantilevered portion 152 and its pair of leg portions 154, 156 so as to selectively engage its respective one of the plurality of connector pins 116, 118, 120, 122.

The plurality of spring members 144, 146, 148, 150 are yieldably biased by means well known in the art such as an built in resilient spring bias so as to urge their respective cantilevered portion 152 towards the top surface 106 and their respective electrically conductive bars 132, 134, 136, 138 against the connector pins 116, 118, 120, 122 respectively thereby creating an electrical interconnection therebetween. Thus, as is readily apparent from FIGS. 4A-4E, when the plurality of connector pin 116, 118, 120, 122 are not soldered to their complementary surface pads 128, the spring members 144, 146, 148, 150 urge their respective electrically conductive bar 132, 134, 136, 138 against and into electrical connection with their respective connector pins 116, 118, 120, 122. In this manner, the shorting of all of the connector pins 116, 118, 120, 122 is accomplished so as to effectively protect the semiconductor die (not shown) within the SCP 104 from ESD which could operate to damage the electrical circuitry in the semiconductor die.

Positioning the connector pins 116, 118, 120, 122 over the complementary surface pads 128 in the connector 124 in readiness for soldering operates to move and deflect upwards the leg portions 154, 156 of all the spring members 144, 146, 148, 150 against their yieldable bias, thereby moving all the electrically conductive bars 132, 134, 136, 138 out of physical and electrical connection with the connector pins 116, 118, 120, 122.

As will be readily apparent, the connector pins 116, 118, 120, 122 On all the interface surfaces 108, 110, 112, 114 need not be shorted together by this ESD protection device 104 but may be limited to those connector pins found in any select subset of all the interface surfaces.

Figure 5A:
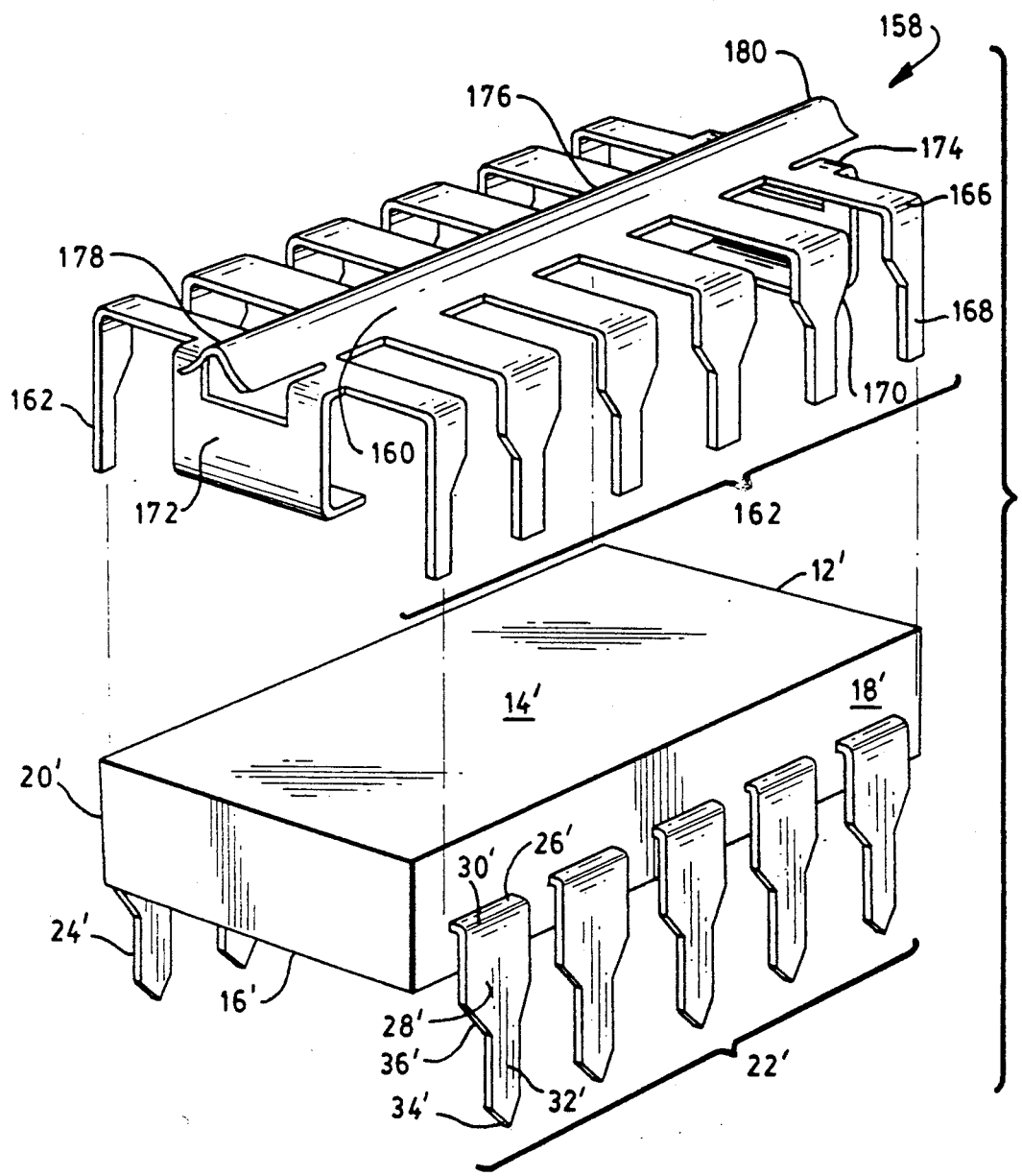
FIG. 5A is an exploded perspective view of another ESD protection device of this invention disposed above a SCP.
Figure 5B:
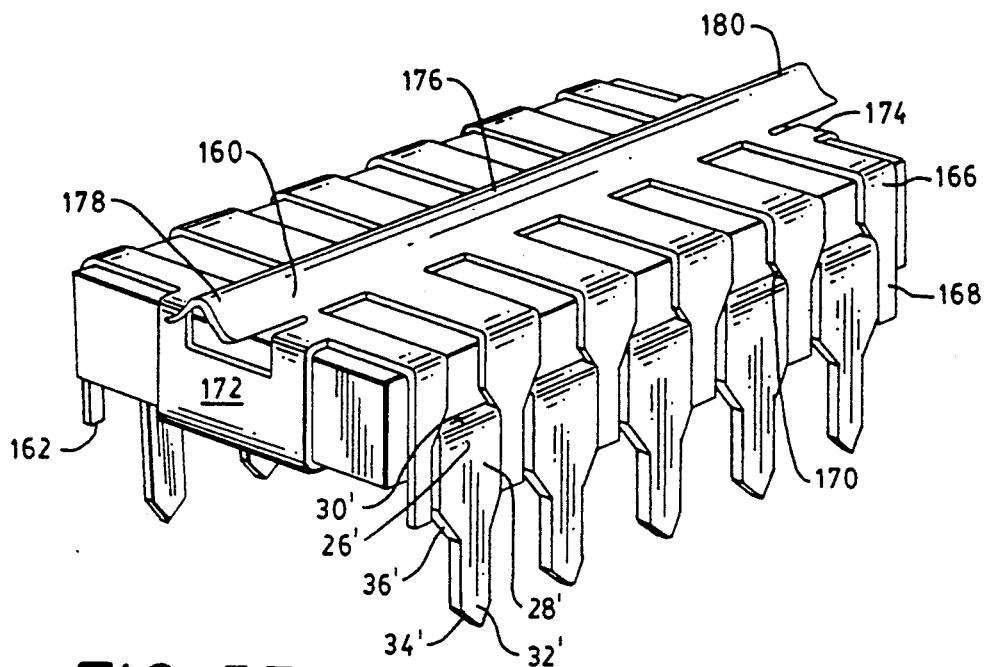
FIG. 5B is a perspective view of the ESD protection device shown in FIG. 5A mated to the top surface of the SCP shown in FIG. 5A.
Figure 5C:
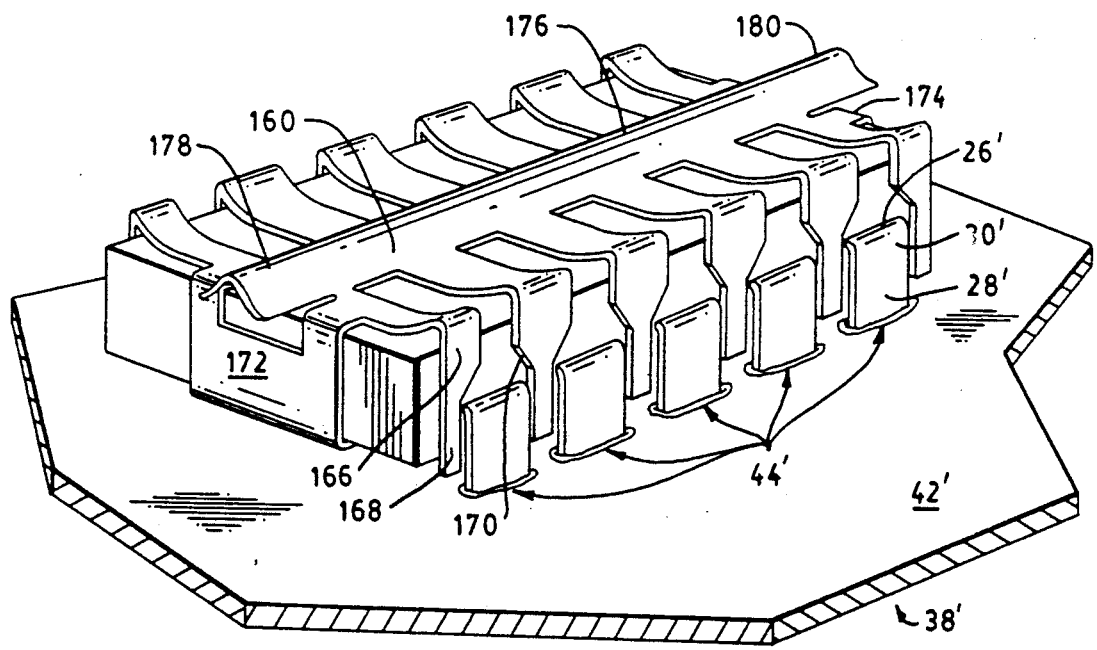
FIG. 5C is a perspective view of the ESD protection device-SCP sub-assembly shown in FIG. 5B mated to a printed circuit board.

Referring now to FIGS. 5A-5C where like numerals designate previously described elements, there is shown a fifth embodiment of the ESD protection 158 for the SCP 12' and the connector 38'. This unitary ESD protection device 158 comprises a base section 160 which may be overlaid on and secured to the top surface 14' of the SCP 12' and a plurality of shorting arms 162. The plurality of shorting arms 162 extend outwardly from the base section 160 with distal end portions 168 in spaced apart relationship with respect to each other and in spaced apart alignment with respect to the plurality of connector pins 22', 24'. Each of the plurality of shorting arms 162 has a first portion 166 which is integral to the base section 160 and which extends outwardly from the base section 160 in an integral connection to a respective one of the distal end portions 168. Moreover, each first portion 166 is also wider than its distal end portion 168 so as to define lateral edge portions 170.

A pair of clips 172, 174 are disposed on the ends of the base section 160 of the ESD protection device 158 which grip the top surface 14' and the bottom surface 16' of the SCP 12' and secure the base section 160 of the ESD protection device 158 to the top surface 14' of the SCP 12'. Alternatively, an adhesive (not shown) disposed on either base section 160 or the top surface 14' of the SCP 12' can also provide the ESD protection device 158 with a secure attachment to the SCP 12'. A stiffening rib 176 is disposed integrally within the base section 160 to provide stiffness to the base section 160 so as to prevent lateral movement from occurring in the base section 160 when the distal end portions 168 of the shorting arms 162 move away from their respective connector pins 22'. Cantilevered end portions of the stiffening rib 176 extend beyond the corresponding end portions of the base section 160 and define a pair of pull tabs 178, 180 which provide for the quick and easy removal of the ESD protection device 158 from the SCP 12'.

The shorting arms 162 are yieldably biased by means well known in the art such as a built in resilient spring bias so as to urge the lateral edge portions 170 of adjacent pairs of shorting arms 162 against the first portions 26' of respective ones of the connector pins 22', 24' thereby creating an electrical interconnection between the plurality of the shorting arms 162 and the plurality of connector pins 22', 24'. Thus, as is readily apparent from FIGS. 5A-5C, when the plurality of connector pins 22', 24' are not inserted into the corresponding plurality of receptacles 44', the shorting arms 162 urge their respective lateral edge portions 170 against and into electrical connection with the first portions 26' of respective connector pins 22', 24'. In this manner, the shorting of all of the plurality of connector pins 22', 24' is accomplished so as to effectively protect the semiconductor die (not shown) within the SCP 12' from the ESD which could operate to damage the electrical circuitry within the semiconductor die. Insertion of the connector pins 22', 24' into the complementary receptacles 44' operates to move and deflect upwards the distal end portions 168 of the shorting arms 162 against their yieldable bias, thereby moving the lateral edge portions 170 out of physical and electrical connection with the first portions 26' of the connector pins 22', 24'.

As can be seen from FIGS. 5A-5C, the shorting arms 162 at the ends of the base section 160 define only one lateral edge portion 170 while the intermediate shorting arms 162 each define two lateral edge portions 170 that engage respectively adjacent connector pins 22', 24'. In this manner, each connector pin 22', 24' is shorted by being engaged by two lateral edge portions 170 from two adjacent shorting arms 162. This redundancy, as should be readily apparent, operates to substantially improve the reliability of the ESD protection device 158.

As will be readily apparent, the number of connector pins 22', 24' to be shorted together by this ESD protection device 158 need not include all the connector pins 22', 24' as shown in FIGS. 5A-5C but may also be limited to any subset of all the conductive pins. Moreover, only a subset of all the connector pins 22', 24' on just one interface surface 18', 20' may be shorted together by this ESD protection device 158 while all the connector pins 22', 24' remain unshorted.

Referring now to FIGS. 6A-6B and FIGS. 7A-7B where like numerals designate previously described elements, there is shown a sixth and a seventh embodiment of the ESD protection device 182 for the SCP 12'. The distinguishing features between the sixth and seventh embodiments are the slots 202, explained below, found in the ESD protection device shown in FIGS. 7A-7B but not in FIGS. 6A-6B. In FIGS. 6 and 7, the ESD protection device 182 comprises a base section 184 secured to the top surface 14' of the SCP 12' and a plurality of shorting arms 186 which are integral to the base section 184. Just as in the ESD protection device embodiment of FIG. 5A-5C, a pair of clips 188, 190 are disposed on the ends of the base section 184 of the ESD protection device 182 which grip the top surface 14' and the bottom surface 16' of the SCP 12' and secure the base section 184 of the ESD protection device 182 to the top surface 14' of the SCP 12'. Alternatively, an adhesive (not shown) disposed on either base section 184 or the top surface 14' of the SCP 12' can also provide the ESD protection device 182 with a secure attachment to the SCP 12'. A stiffening rib 192 is also disposed integrally within the base section 184 and provides stiffness to the base section 184 so as to prevent lateral movement from occurring in the base section 184. Cantilevered end portions of the stiffening rib 192 also extend beyond the corresponding end portions of the base section 184 and define a pair of pull tabs 194, 196 which provide for the quick and easy removal of the ESD protection device 182 from the SCP 12'.

The plurality of shorting arms 186, as in the embodiment of FIGS. 5A-5C, extend outwardly from the base section 184 in a spaced apart relationship with respect to each other and in a spaced apart alignment with respect to the plurality of connector pins 22', 24'. Unlike the embodiment of FIGS. 5A-5C, however, each of the plurality of shorting arms 186 has an integral member 198 extending outwardly and downwardly from the base section 184 to define at least one lateral edge portion 200 which is moveable into engagement with the first portion 26' of at least one respective connector pin 22'. As can be seen from FIGS. 6A-6B and FIGS. 7A-7B, the shorting arms 186 at the end of the base section 184 define only one lateral edge portion 200 while the intermediate shorting arms 186 each define two lateral edges 200 that engage respectively adjacent connector pins 22', 24'. In this manner, each connector pin 22', 24' is shorted by being engaged by two lateral edge portions 200 from two adjacent shorting arms 186. This redundancy, as should be readily apparent, operates to substantially improve the reliability of the ESD protection device 182.

Figure 6A:
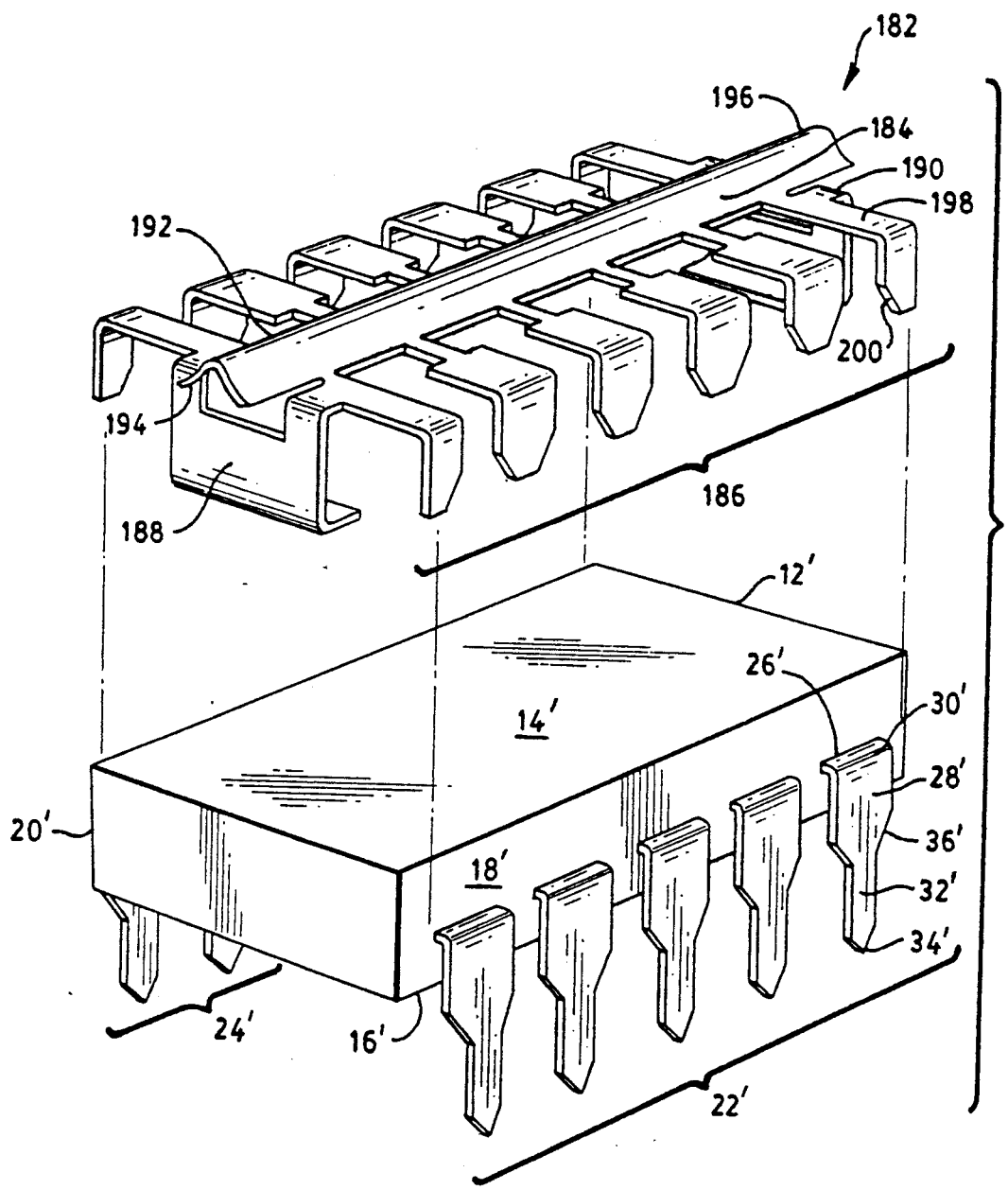
FIG. 6A is an exploded perspective view of another ESD protection device of this invention disposed above a SCP.
Figure 6B:
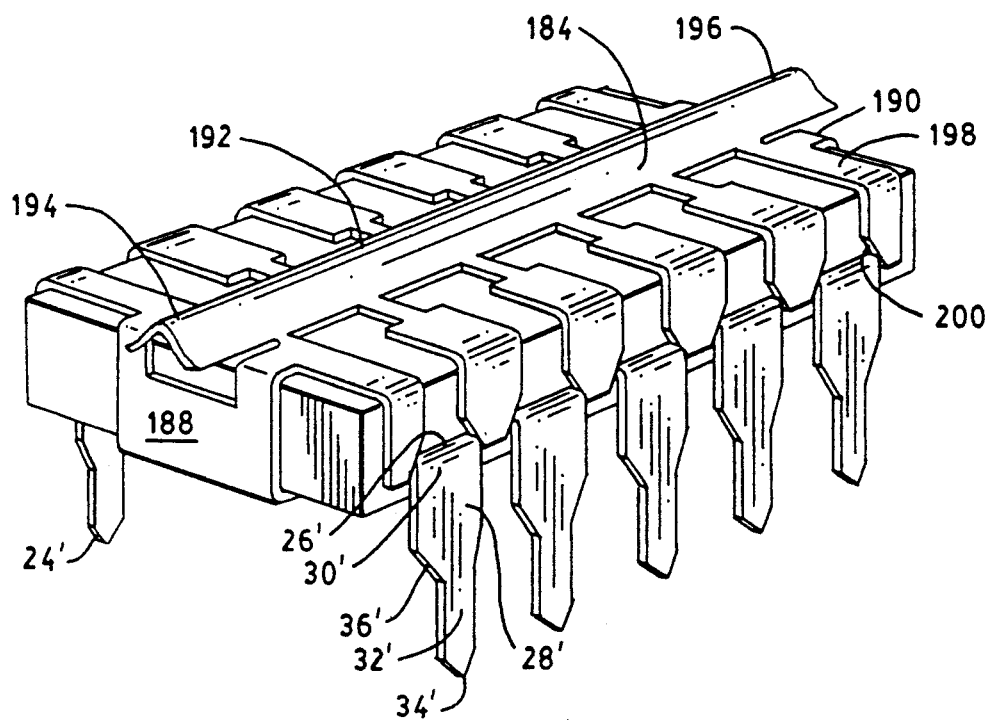
FIG. 6B is a perspective view of the ESD protection device shown in FIG. 6A mated to the top surface of the SCP shown in FIG. 6A.
Figure 7A:
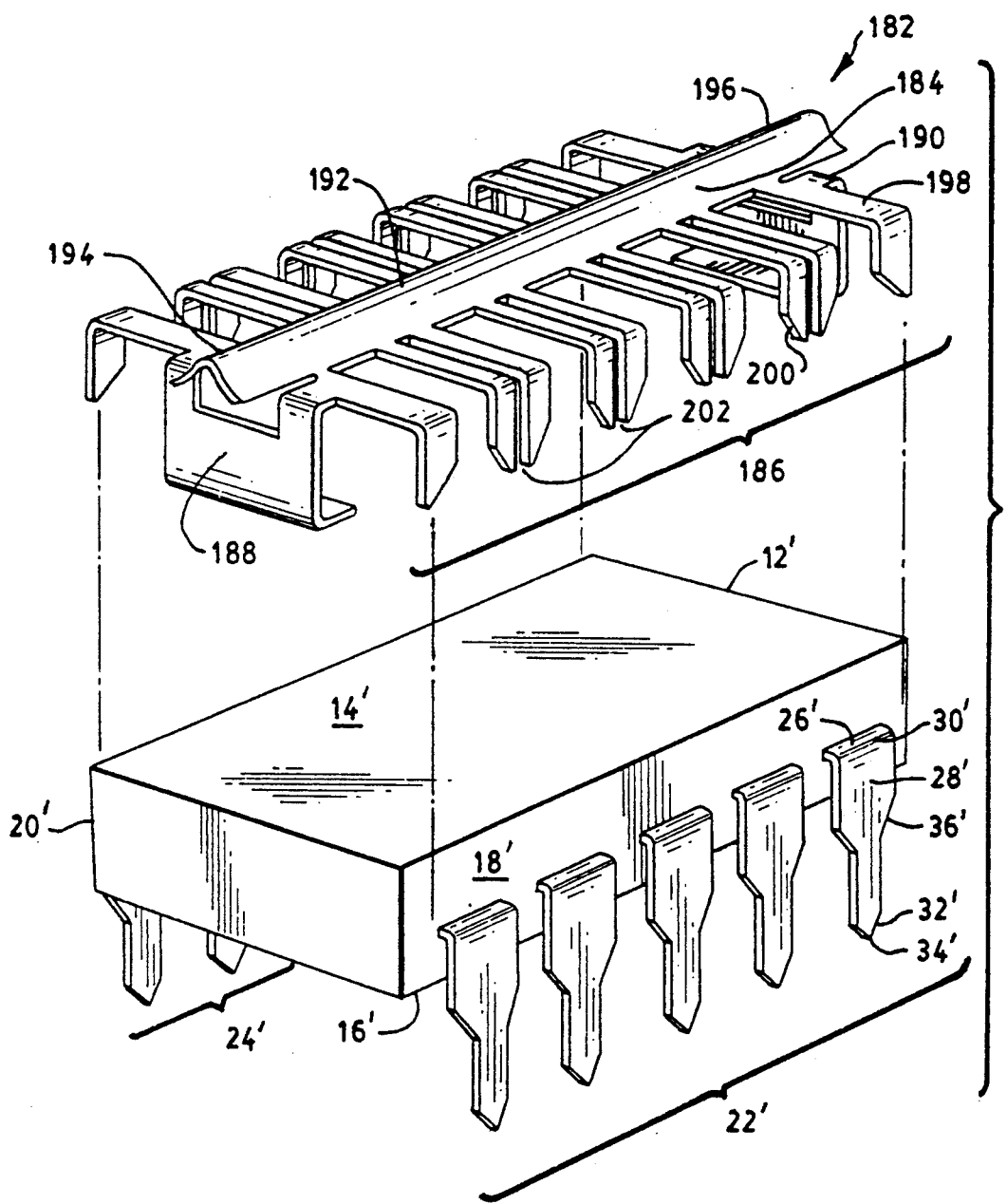
FIG. 7A is an exploded perspective view of another ESD protection device of this invention disposed above a SCP.
Figure 7B:
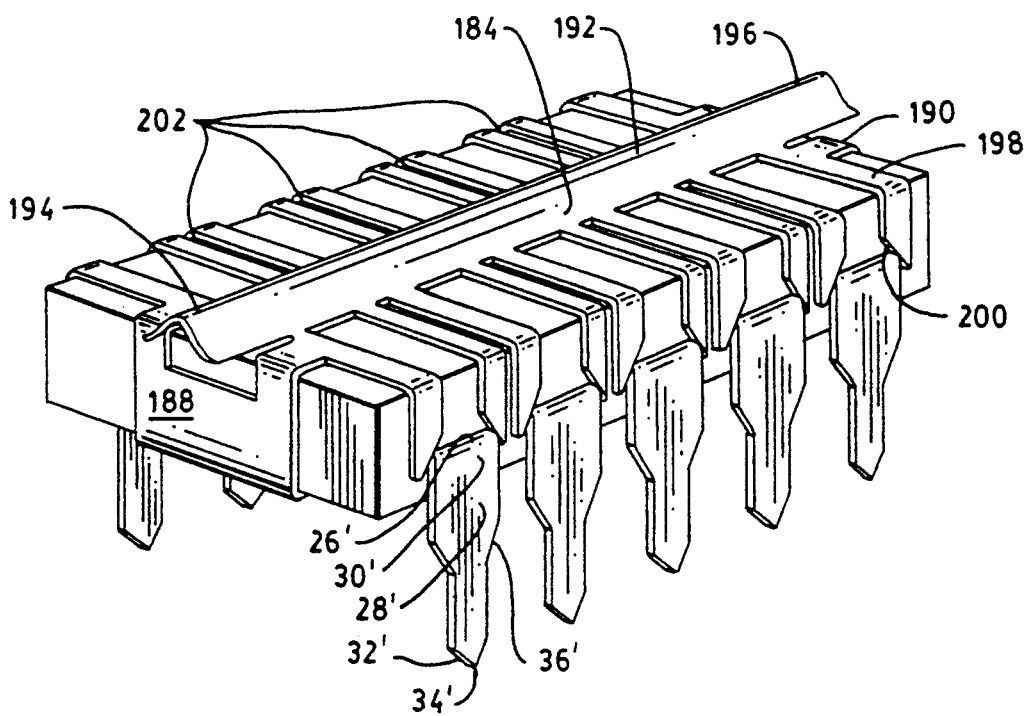
FIG. 7B is a perspective view of the ESD protection device shown in FIG. 7A mated to the top surface of the SCP shown in FIG. 7A.

In FIGS. 7A-7B, there are shown bifurcated shorting arms 186 where slots 202 physically separate adjacent lateral edge portions 200 that were connected in the embodiments of FIGS. 6A-6B. These slots 202 provide each adjacent lateral edge portion 200 with the ability to move independently of the other so as to independently engage the first portion 26' of their respective connector pin 22', 24'. In FIGS. 6 and 7, the lateral edge portions 200 always electrically interconnect the shorting arms 186 to the plurality of connector pins 22', 24', regardless, of whether or not the connector pins 22', 24' are inserted into the complementary receptacles (not shown) of a connector (not shown) because this embodiment lacks the means for urging the lateral edge portions 200 away from their respective first portions 26'. Thus, only the physical removal of this ESD protection device from the top surface 14' of the SCP 12' by grasping and pulling the pull tabs 194, 196 will electrically disconnect the shorting arms 186 from the connector pins 22', 24'.

As was the case in the ESD protection device embodiment 158 of FIGS. 5A-5C, the number of connector pins 22', 24' on either surface 18', 20' to be shorted together by the ESD protection device embodiment 182 of FIGS. 6A-6B and FIGS. 7A-7B need not include all the connector pins 22', 24' but may also be limited to any subset of all the connector pins. Moreover, only a subset of all the connector pins 22', 24' on just one interface surface 18', 20' may be shorted together by this ESD protection device 182 while all the other connector pins 22', 24' remain unshorted.

Figure 8A:
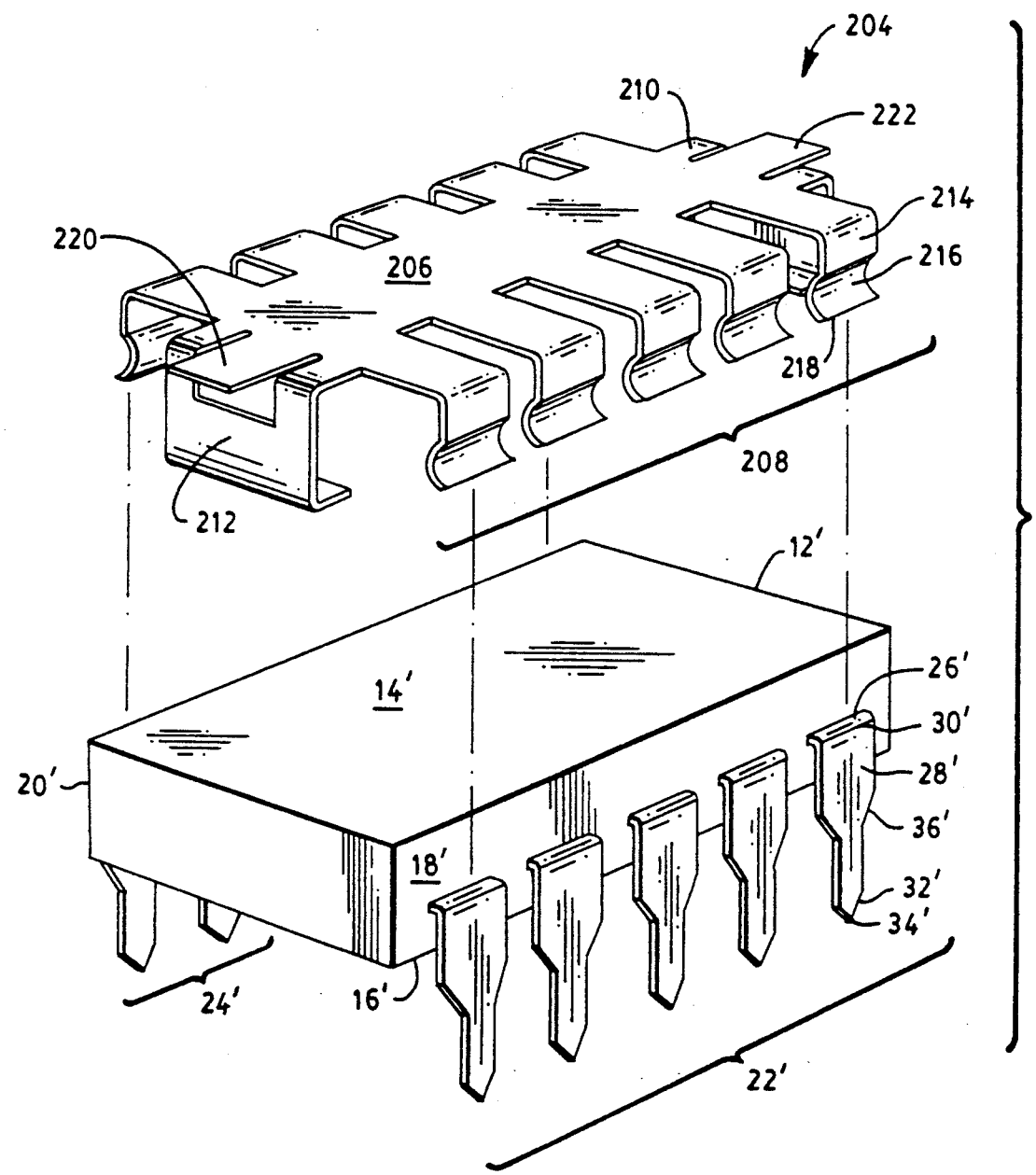
FIG. 8A is an exploded perspective view of another ESD protection device of this invention disposed above a SCP.
Figure 8B:
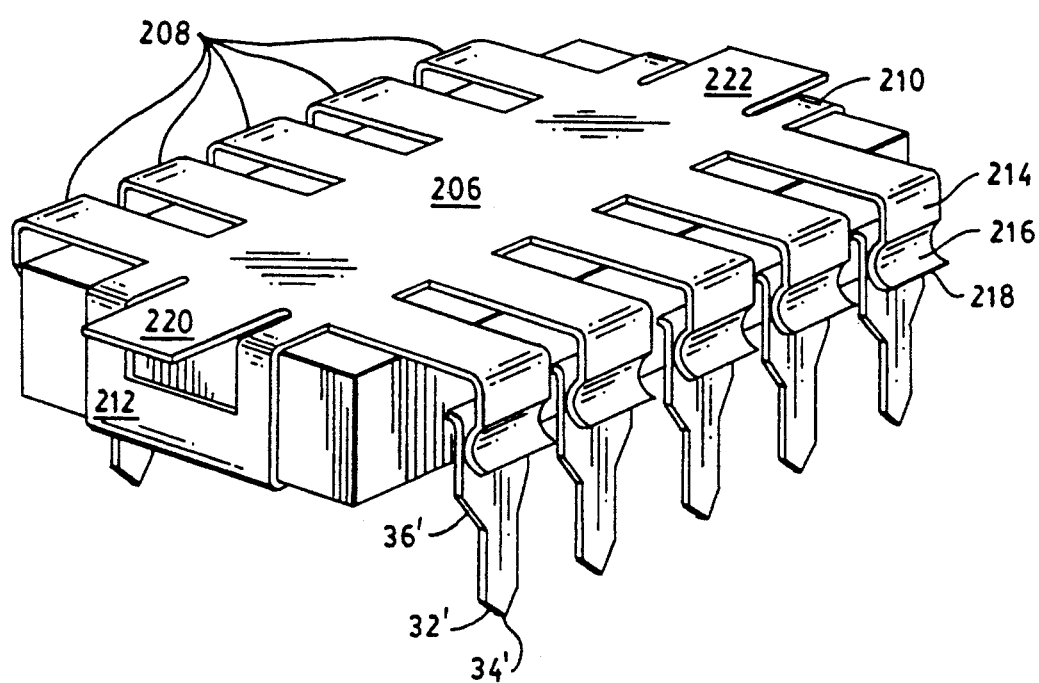
FIG. 8B is a perspective view of the ESD protection device shown in FIG. 8A mated to the top surface of the SCP shown in FIG. 8A.

Referring now to FIGS. 8A-8B where like numerals designate previously described elements, there is shown an eight and final embodiment of the ESD protection device 204 for the SCP 12'. This ESD protection device 204 comprises a base section 206 which can be secured to the top surface 14' of the SCP 12' and a plurality of shorting arms 208 which are integral to the base section 206. A pair of clips 210, 212 are disposed on the ends of the base section 206 of the ESD protection device 204 and grip the top surface 14' and the bottom surface 16' of the SCP 12' to secure the base section 206 of the ESD protection device 204 to the top surface 14' of the SCP 12'. Alternatively, an adhesive (not shown) disposed on either base section 206 or the top surface 14' of the SCP 12' can also provide the ESD protection device 204 with a secure attachment to the SCP 12'.

The plurality of shorting arms 208 extend outwardly from the base section 206 in a spaced apart relationship with respect to each other and in an overlying spaced apart relationship with respect to corresponding ones of the plurality of connector pins 22', 24'. Each shorting arm 208 has a member 214 which is integral to the base section 206 and which extends outwardly and downwardly from the base section to define an integral protuberance 216 at its distal end 218. Each member 214 is resiliently biased so that the protuberance 216 at the distal end 218 thereof engages and electrically shorts the second portion 28' of a corresponding one of the connector pins 22', 24'. The ESD protection device 204 may also be removed from the SCP 12' in the aforementioned manner by grasping and pulling the pull tabs 220, 222. Moreover, as will be readily apparent, the width of an individual shorting arm 206 in the ESD protection device 204 may be varied so that the accompanying protuberance will short together any subset of the connector pin 22', 24' on a given interface surface 18', 20' at the same time.

Other embodiments of the invention including additions, subtractions, deletions, and other modifications of the preferred disclosed embodiments of the invention will be obvious to those skilled in the art and are within the scope of the following claims.

What is claimed is:

1. An electrostatic discharge (hereafter referred to as "ESD") protection device for use with a semiconductor chip package (hereafter referred to as "SCP") of the type having a top and opposite bottom surface and at least a pair of interface surfaces connecting the top and bottom surfaces, each interface surface having a plurality of connector pins disposed thereon in a substantially parallel and spaced apart relationship with respect to each other, each connector pin having a portion extending outward from the interface surface and downward at its distal end so as to extend beyond the bottom surface, the plurality of connector pins being structured for connection to a connector of the type having a plurality of receptacles complementary to the plurality of connector pins to accommodate the insertion of the plurality of connector pins into the respective receptacles, the ESD protection device comprising:

a) a base section having a substantially planar surface which may be overlaid on and secured to the top surface of the SCP; and b) a plurality of shorting arms integral to the base section and extending outward therefrom with distal end portions in spaced apart relationship with respect to each other and in a spaced apart alignment with respect to a select plurality of connector pins when the ESD protection device is secured to the SCP, each shorting arm having a first portion integral to the base section and extending outwardly therefrom in integral connection to a respective one of the distal end portions, each first portion being wider than its respective distal end portion so as to define at least one lateral edge portion moveable into engagement with respect to at least one of the connector pins, each shorting arm further comprising means for yieldably biasing the shorting arm so as to urge the lateral edge portions of adjacent pairs of shorting arms against respective ones of the connector pins thereby creating an electrical connection therebetween when the connector pins are not inserted into the complementary receptacles in the connector, each distal end portion being engaged by the receptacle to move its respective first portion apart from its respective connector pin against its yieldable bias so as to disengage its lateral edge portion from its respective one connector pin to break the electrical connection therebetween in response to the insertion of the connector pins into the respective receptacles.

2. The ESD protection device of claim 1 further comprising end portions extending from opposite ends of the base section and integral therewith, each end portion defining a clip which can be removably secured around the top and bottom surfaces of the SCP so that the base section is securely mounted to the SCP.

3. The ESD protection device of claim 2 wherein the base section further comprises a stiffening rib disposed integrally within the base section, the stiffening rib having end portions which extend beyond the opposite end portions of the base section, each end portion of the stiffening rib defining a tab which can be gripped so that the ESD protection device can be easily removed from the top surface.

4. The ESD protection device of claim 1 further comprising an adhesive for securely mounting the base section to the top surface.

5. The ESD protection device of claim 1 for use with SCP's of the type wherein each connector pin further comprises a first portion extending outward from the interface surface, a second portion of substantially the same width as the first portion extending in a downward direction, a bent portion interconnecting the first and second portions, a third portion narrower than the first and second portions extending downward to its distal end, and an interface portion interconnecting the second and third portions, wherein the distal end portion of each shorting arm extends below the interface portion of each connector pin and each receptacle is of sufficient width to accommodate insertion of only the third portion of each respective connector pin therein.

6. The ESD protection device of claim 5 wherein the lateral edge portions of each shorting arm engages its corresponding at least one connector pin at the first portion.

7. An electrostatic discharge (hereafter referred to as "ESD") protection device for use with a semiconductor chip package (hereafter referred to as "SCP") of the type having a top and opposite bottom surface and at least a pair of interface surfaces connecting the top and bottom surfaces, each interface surface having a plurality of connector pins disposed thereon in a substantially parallel and spaced apart relationship with respect to each other, each connector pin having a first portion extending outward from the interface surface, a second portion extending downward at its distal end so as to extend beyond the bottom surface, and a bent portion interconnecting the first and second portions, the plurality of connector pins being structured for connection to a connector of the type having a plurality of receptacles complementary to the plurality of connector pins to accommodate the insertion of the plurality of connector pins into the respective receptacles, the ESD protection device comprising:

a) a base section having a substantially planar surface which may be overlaid on and secured to the top surface of the SCP;

b) a plurality of shorting arms integral to the base section and extending outward therefrom in spaced apart relationship with respect to each other and in a spaced apart alignment with respect to a select plurality of connector pins when the ESD protection device is secured to the SCP, each shorting arm having a member integral to the base section and extending outwardly and downwardly therefrom to define at least one lateral edge portion at its distal end moveable into engagement with at least one respective connector pin at the first portion, each shorting arm further comprising means for yieldably biasing the shorting arm so as to urge the lateral edge portions of adjacent pairs of shorting arms against respective ones of the connector pins thereby creating an electrical connection therebetween; and c) means on the shorting arms for automatically moving them out of engagement with the connector pins when the connector pins are inserted into the complementary receptacles.

8. The ESD protection device of claim 7 further comprising end portions extending from opposite ends of the base section and integral therewith, each end portion defining a clip which can be removably secured around the top and bottom surfaces of the SCP so that the base section is securely mounted to the SCP.

9. The ESD protection device of claim 8 wherein the base section further comprises a stiffening rib disposed integrally within the base section, the stiffening rib having end portions which extend beyond the opposite end portions of the base section, each end portion of the stiffening rib defining a tab which can be gripped so that the ESD protection device can be easily removed from the top surface.

10. The ESD protection device of claim 7 further comprising an adhesive for securely mounting the base section to the top surface.

11. The ESD protection device of claim 7 wherein select shorting arms are bifurcated so as to separate a pair of lateral edge portions within each select shorting arm from the other.

* * * * *